United States Patent
Chu et al.

(10) Patent No.: US 6,650,538 B1
(45) Date of Patent: Nov. 18, 2003

(54) FIN HEAT SINK AND AIRFLOW TUBE ASSEMBLY EMPLOYING ANNULAR AIRFLOWS, AND METHODS OF FABRICATION THEREOF

(75) Inventors: Richard C. Chu, Hopewell Junction, NY (US); Michael J. Ellsworth, Jr., Lagrangeville, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/197,108

(22) Filed: Jul. 17, 2002

(51) Int. Cl.⁷ .............................................. H05K 7/20
(52) U.S. Cl. .................. 361/688; 165/80.3; 165/185; 165/121; 257/722; 361/694; 361/695; 361/703
(58) Field of Search ............... 165/80.3, 185, 165/121–126, 908; 361/688–697, 703; 257/722; 454/184

(56) References Cited

U.S. PATENT DOCUMENTS

| | | | |
|---|---|---|---|
| 4,277,816 A | * 7/1981 | Dunn et al. .................. 361/694 |
| 4,449,164 A | * 5/1984 | Carlson et al. ............... 361/694 |
| 4,932,467 A | 6/1990 | Wigmore et al. .............. 165/96 |
| 5,303,555 A | 4/1994 | Chrysler et al. ................. 62/6 |
| 5,365,400 A | 11/1994 | Ashiwake et al. ........... 361/752 |
| 5,704,419 A | 1/1998 | Agonafer et al. ............ 165/121 |
| 6,094,347 A | 7/2000 | Bhatia ......................... 361/695 |
| 6,141,215 A | 10/2000 | Podwalny et al. ........... 361/687 |
| 6,525,936 B2 | * 2/2003 | Beitelmal et al. ............ 361/695 |

* cited by examiner

Primary Examiner—Gregory Thompson
(74) Attorney, Agent, or Firm—Andrew J. Woinicki, Jr., Esq.; Kevin P. Radigan, Esq.; Heslin Rothenberg Farley & Mesiti, P.C.

(57) ABSTRACT

A cooling apparatus and method of fabrication are provided for cooling one or more heat generating components. The cooling apparatus includes a heat sink structure and an airflow tube assembly. In one embodiment, the heat sink structure has a first surface for coupling to one or more heat generating components, and a second surface having at least one fin extending therefrom. The airflow tube assembly has at least one airflow tube which is sized to at least partially receive the at least one fin of the heat sink structure, wherein an annular airflow can be established between the at least one airflow tube and the at least one fin of the heat sink structure, thereby enhancing heat transfer from the heat sink structure to the airflow and cooling of the heat generating component(s).

22 Claims, 8 Drawing Sheets

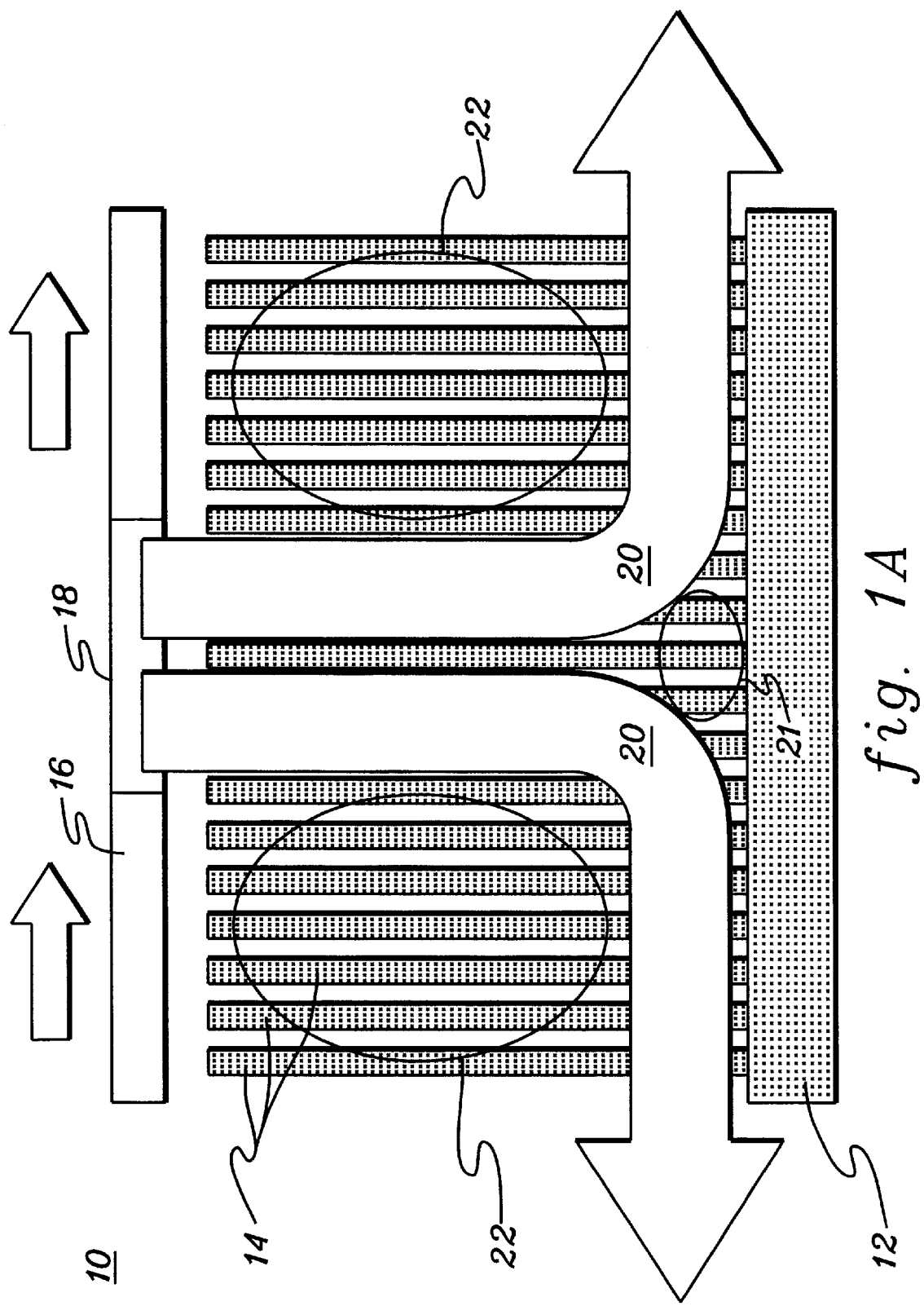

FIN HEAT SINK AND AIRFLOW TUBE ASSEMBLY EMPLOYING ANNULAR AIRFLOWS, AND METHODS OF FABRICATION THEREOF

TECHNICAL FIELD

The present invention relates to heat transfer mechanisms; for example, to heat transfer mechanisms and cooling assemblies for removing heat generated by an electronic circuit module. More particularly, this invention relates to a cooling apparatus for cooling a heat generating component of an electronic module employing an airflow cooled heat sink structure.

BACKGROUND OF THE INVENTION

The efficient extraction of heat from electronic circuit modules for very large scale integrated circuit packages has presented a significant limitation on the design and use of such electronic modules. The power consumed in the integrated circuits generates heat which must in turn be removed from the package. Lacking an efficient heat transfer mechanism, the speed, reliability and power capabilities of the electronic circuit modules are limited. As the density of circuitry within very large scale integrated circuit chips has increased, the need for improved heat extraction has become even more acute since more densely packed chips tend to have a higher need for heat dissipation per unit area. It is also known that runaway thermal conditions and excessive heat generated by chips is a leading cause of failure of chip devices. Furthermore it is anticipated that demand for heat removal from these devices will continue to increase indefinitely. Accordingly, it is seen that there is a significant need to continue to further improve upon cooling mechanisms for electronic devices, and in particular, to further improve upon air cooling capability for such devices.

SUMMARY OF THE INVENTION

The shortcomings of the prior approaches are overcome, and additional advantages are provided, by the present invention which in one aspect comprises a cooling assembly for facilitating heat transfer from an electronic module. Moreover, it should be understood that a cooling assembly in accordance with the present invention is not limited to cooling electronic modules, but rather, has many applications such as, for example, cooling heat generating mechanical components. For simplicity, the following discussion of a cooling assembly in accordance with an aspect of the present invention is focused on cooling electronic modules, with the understanding that it may be employed with other applications as well.

In one embodiment, a cooling apparatus in accordance with an aspect of the present invention includes a heat sink structure and an airflow tube assembly. The heat sink structure has a first surface for coupling to one or more heat generating components, and a second surface with at least one air-cooled fin extending therefrom. The airflow tube assembly has at least one airflow tube, with the at least one airflow tube being sized to at least partially receive the at least one fin of the heat sink structure. An annular airflow can be established between the at least one airflow tube and the at least one fin of the heat sink structure, thereby enhancing heat transfer from the heat sink structure to the airflow and cooling of the heat generating component.

In another aspect, an electronic assembly is provided which includes an electronic module comprising a heat generating component, and a cooling apparatus coupled to a surface of the electronic module for removing heat generated by the heat generating component. The cooling apparatus includes a heat sink structure and an airflow tube assembly. The heat sink structure has a first surface coupled to the heat generating component and a second surface with at least one fin extending therefrom. The airflow tube assembly has at least one airflow tube, with the at least one airflow tube being sized to at least partially receive the at least one fin of the heat sink structure. An annular airflow can be established between the at least one airflow tube and the at least one fin of the heat sink structure to enhance heat transfer from the heat sink structure to air and cooling of the heat generating component.

In a further aspect, a method of fabricating a cooling apparatus for a heat generating component is provided. The method includes: providing a heat sink structure having a first surface for coupling to the heat generating component and a second surface with at least one fin extending therefrom; and providing an airflow tube assembly having at least one airflow tube, the at least one airflow tube being sized to at least partially receive the at least one fin of the heat sink structure, wherein an annular airflow can be established between the at least one airflow tube and the at least one fin of the heat sink structure, thereby enhancing heat transfer from the heat sink structure to air and cooling of the heat generating component.

Advantageously, provided herein is a fin heat sink structure and airflow tube assembly which employ annular airflows to improve thermal performance of the cooling apparatus; that is, to provide lower temperatures at a given heat load or more heat removal at a given temperature by applying more uniform convective heat transfer on the fins, such as long, pin-type fins. In one embodiment, a uniform parallel annular airflow can be provided along the surface of the fins with a high heat transfer coefficient along the entire length of the fin by defining a small annular gap around each fin, for example, 10 mils or less. In addition, the benefit of a high heat transfer coefficient on the heat sink base due to the impinging airflow is retained.

Additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 1A is a cross-sectional view of one embodiment of a pin fin heat sink with impinging cooling airflow;

BEST MODE FOR CARRYING OUT THE INVENTION

Figure 1B:
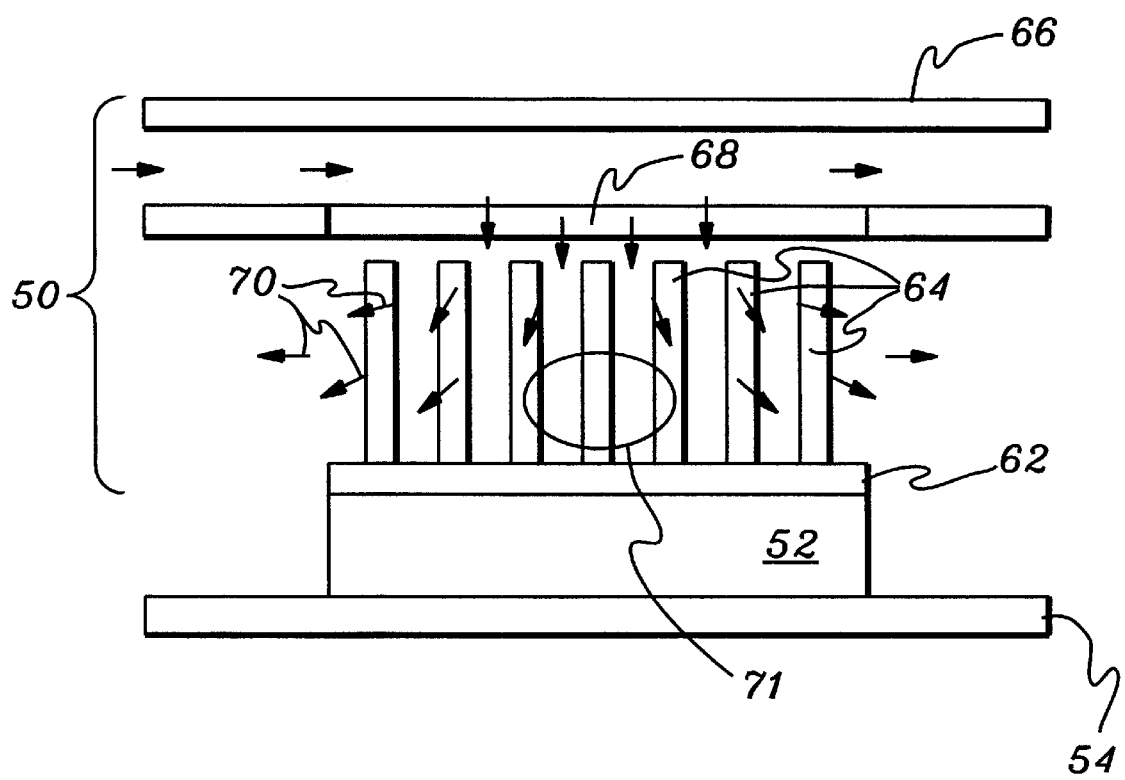
FIG. 1B is a cross-sectional view of an alternate embodiment of a pin fin heat sink with impinging airflow.

As noted briefly above, in order to achieve increases in processor performance, the power dissipation of integrated circuit chips and modules containing the chips continues to increase. This trend presents a challenge to extend air cooling capability. One approach to achieve improved air cooling capability would be to employ airflow in concert with a pin fin heat sink as shown in FIGS. 1A & 1B.

In FIG. 1A, the cooling assembly, generally denoted 10, includes a heat sink structure 12 having a plurality of fins 14 extending from a main surface thereof. A cooling air supply duct 16 includes an orifice 18 which allows airflow 20 to impinge upon the main surface of heat sink 12.

With impinging airflow 20, there are shown multiple regions that experience little or no airflow. These regions experience minimal convective heat transfer, and as a result, the thermal transfer potential of fins 14 is not fully realized. In particular, a stagnation region 21 is defined near the base surface of heat sink 12 where airflow 20 impinges. In addition, large bypass regions 22 are formed in this example due to the height of pin fins 14 extending from heat sink 12 relative to the size of orifice 18 through which airflow 20 is supplied. The extra height of fins 14 in regions 22 minimally assists in heat transfer since the airflow substantially bypasses these regions.

One solution to reducing the size of bypass regions 22 would be to increase the size of orifice 18 relative to fins 14. This can eliminate the bypass regions, however, as shown in FIG. 1B, it also results in enlargement of the stagnation region 71.

Specifically, FIG. 1B depicts one embodiment of a cooling assembly 50 disposed atop an electronic module 52 which is mounted to a printed circuit board 54. Assembly 50 includes a heat sink structure 62 having multiple pin fins 64 extending from a main surface thereof. Air 70 is supplied through an orifice 68 in a cooling air supply duct 66. As shown in the figure, the airflow seeks the path of least resistance and upon entering the region of the pin fins starts turning towards the perimeter of the heat sink. This results in relatively less airflow in the central portion of the heat sink, hampering heat transfer in this stagnation region 71. In addition, the heat transfer coefficients obtained are highest where the flow impinges structure 62 and are of reduced magnitude along the cylindrical surface of the pin fins 64 where the greatest area of airflow, and thus heat transfer, is available.

Generally stated, provided herein is an enhanced fin heat sink which employs an airflow tube assembly to facilitate establishing annular airflow around the fins in order to eliminate both the bypass region and the stagnation region of the air-cooled heat sinks of FIGS. 1A & 1B. In one aspect, a heat sink structure and airflow tube assembly as described herein provide uniform parallel annular flow along the surfaces of the pin fins, with a high heat transfer coefficient along the entire length of the fin by virtue of the creation of a small annular gap around each pin (e.g., less than 10 mils). In addition, the assembly disclosed herein benefits from high heat transfer coefficients on the heat sink base by providing an enhanced impinging airflow on the base.

Figure 2A:
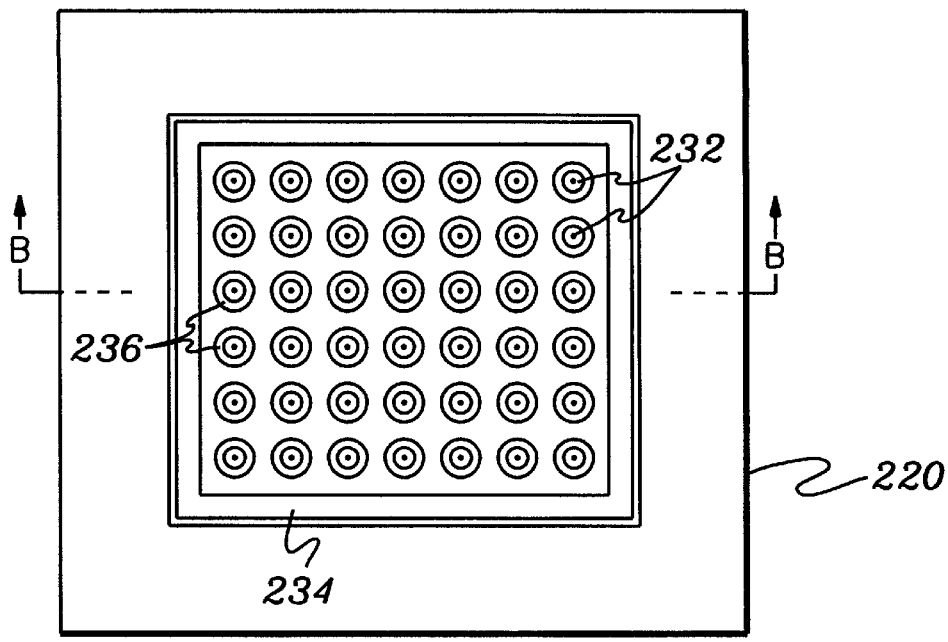
FIG. 2A is a cross-sectional plan view of one embodiment of a cooling assembly (taken along line A—A of FIG. 2B) employing annular airflow cooling, and shown mounted to an electronic module and printed circuit board, in accordance with an aspect of the present invention.
Figure 2B:
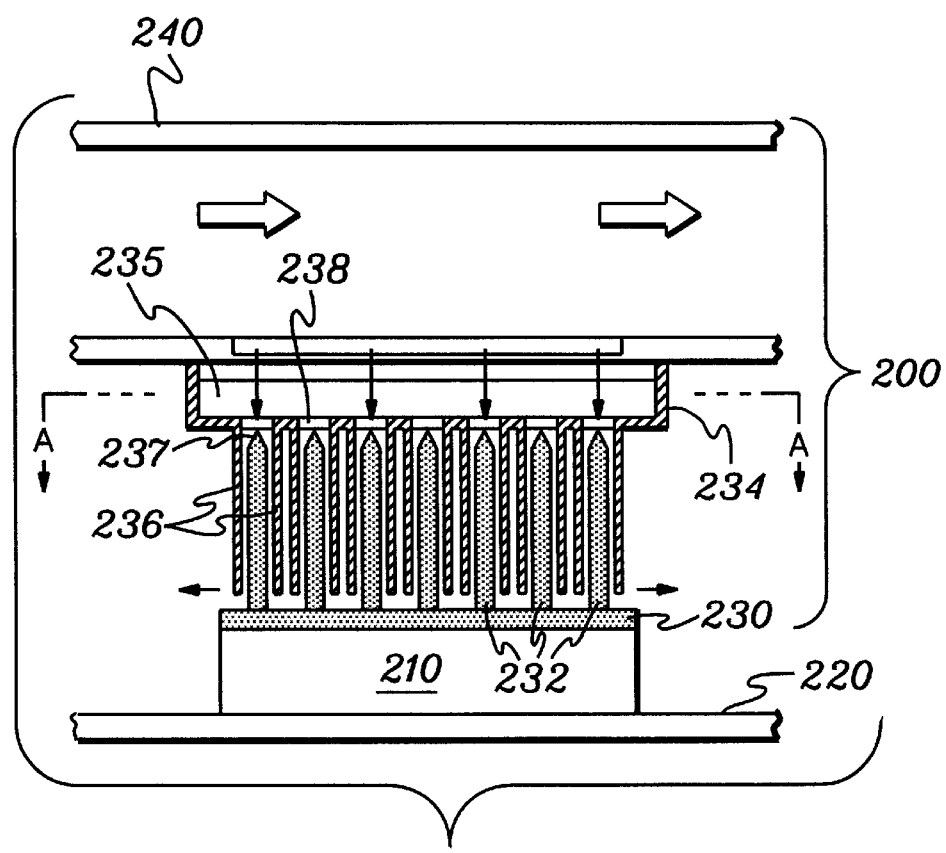
FIG. 2B is a cross-sectional view of the cooling assembly, electronic module and printed circuit board of FIG. 2A taken along line B—B thereof, in accordance with an aspect of the present invention.

FIGS. 2A & 2B depict one embodiment of a cooling assembly 200, in accordance with an aspect of the present invention, mounted atop an electronic module 210 which is connected to a printed circuit board 220. Cooling assembly 200 includes a heat sink structure 230 which has a first main surface coupled to electronic module 210, and a second main surface with a plurality of fins 232 extending therefrom. Electronic module 210 is assumed to comprise one or more heat generating components which are to be cooled employing cooling assembly 200. Fins 232 may comprise, in one example, a plurality of pin fins extending from the second main surface of heat sink structure 230. Although described hereinbelow as pin fins, those skilled in the art will understand that the fins could alternatively comprise various shaped structures. Further, the pin fins discussed herein could have a circular, rectangular, or other radial cross-section.

An airflow tube assembly or shroud 234 resides over fins 232. Assembly 234 includes a plurality of airflow tubes 236 which extend from a plenum 235. Each airflow tube is sized to at least partially receive a respective fin 232 extending from the heat sink structure, wherein an array of parallel, annular flow passages is created between the airflow tubes and the fins. Although not shown in the figures, suitable clamps (or similar means) may be provided to attach the airflow tube assembly, including the plenum, to the heat sink structure. A layer of rubber material may be provided around the top of the plenum to create a seal between the plenum and an air supply duct 240. Air from duct 240 flows into the annular passages defined between each fin and corresponding airflow tube pair.

The heat transfer coefficient within the spaces will generally be inversely proportional to the hydraulic diameter of the individual airflow passages. The hydraulic diameter of an annular passage is twice the annular gap. Consequently, the annular gap between each pin fin and its airflow tube should be made sufficiently small to achieve a high heat transfer coefficient along the complete length of the pin fin. In addition, the annular gaps between fins and their respective airflow tubes may be varied across the surface of the heat sink structure in order to vary the amount of airflow across the passages. For example, it may be desirable to have larger annular passages in the center region of the heat sink structure and tighter passages near an outer edge of the heat sink. By varying the size of the annular passages, a more equal balance of airflow across the array of pins may be achieved. Also, this concept may be advantageous in circumstances where there is a non-uniform heat flux from the electronic module to the heat sink structure.

Figure 3:
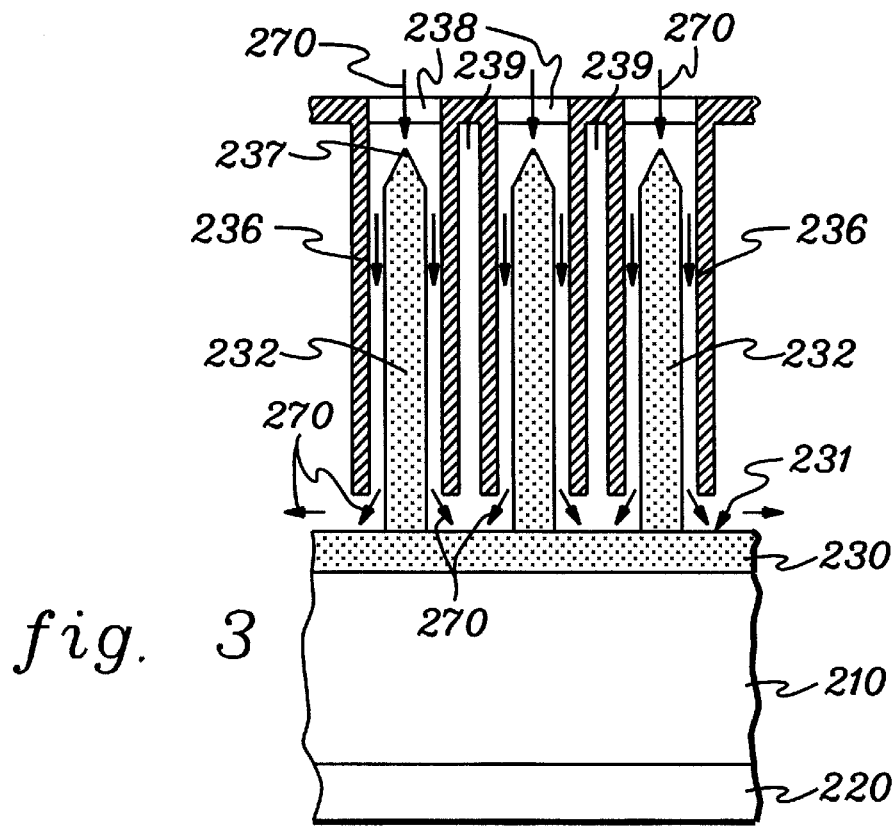
FIG. 3 is a partially enlarged, cross-sectional view of the cooling assembly, electronic module and printed circuit board embodiment of FIGS. 2A & 2B, in accordance with an aspect of the present invention.

A more detailed cross-sectional view of the assembly of FIGS. 2A & 2B is depicted in FIG. 3, showing the annular airflow passages around the fins in greater detail. Again, heat sink structure 230 is shown coupled to electronic module 210, which is connected to printed circuit board 220. Extending from a base surface 231 of heat sink structure 230 are multiple pin fins 232. Disposed over the pin fins are a plurality of airflow tubes 236, with the airflow tubes at least partially receiving the pin fins. The result is the creation of annular airflow passages around the pin fin(s). As shown in FIG. 3, airflow 270 enters through openings 238, passes through the annular passages, and impinges upon base surface 231 of heat sink structure 230 before turning and exhausting out one or more edges of the heat sink structure.

Figure 4:
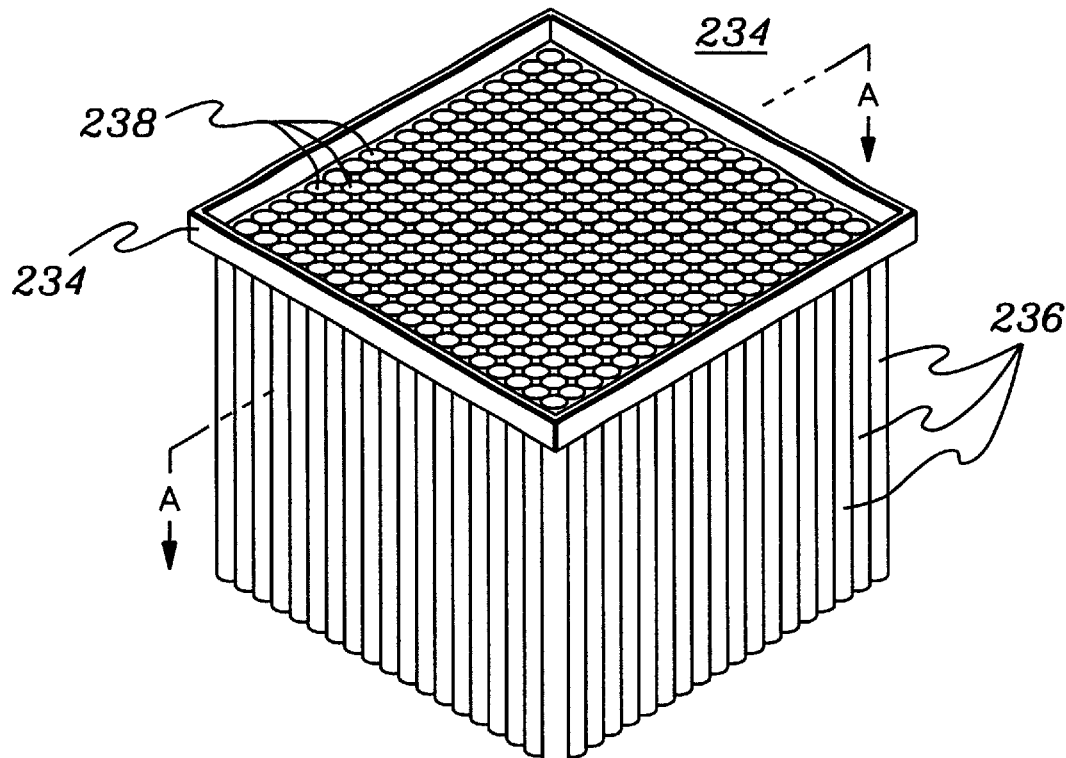
FIG. 4 is an isometric view of one embodiment of an airflow tube assembly comprising a tube shroud to reside over a pin fin heat sink structure, in accordance with an aspect of the present invention.
Figure 4A:
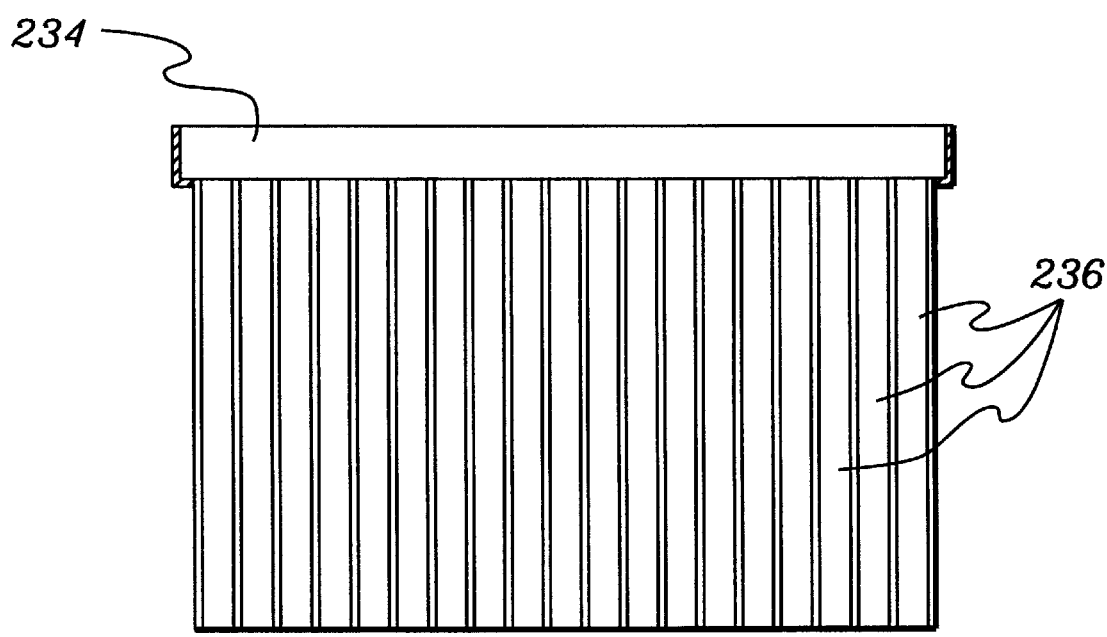
FIG. 4A is a cross-sectional elevational view of the tube shroud of FIG. 4 taken along line A—A thereof, in accordance with an aspect of the present invention.

In this example, space 239 between airflow tubes 236 is exaggerated. In practice, the airflow tubes 236 could be touching or almost touching. Also, as shown in greater detail in this figure, tips 237 of pin fins 232 may be made conical or parabolic in shape to minimize entrance pressure losses of airflow passing through orifices 238 in the plenum 235 (FIGS. 2A & 2B). FIGS. 4 & 4A depict one embodiment of an airflow tube assembly or shroud 234 such as employed in the cooling assembly depicted in FIGS. 2A–3, in accordance with an aspect of the present invention. Airflow cooling assembly 234 includes a plenum 235 with a plurality of orifices 238 disposed therein. A plurality of airflow tubes 236 connect to plenum 235 and align to the plurality of orifices 238 to create airflow passageways. Note that although orifices 238 and airflow tubes 236 are shown to be uniform in FIGS. 4 & 4A, the size of the orifices and the size of the respective airflow tubes could be varied as noted above, for example, to form larger or smaller airflow annuli when the shroud is placed over the pin fins, or alternatively, to accommodate fins of different sizes and shapes.

Figure 5:
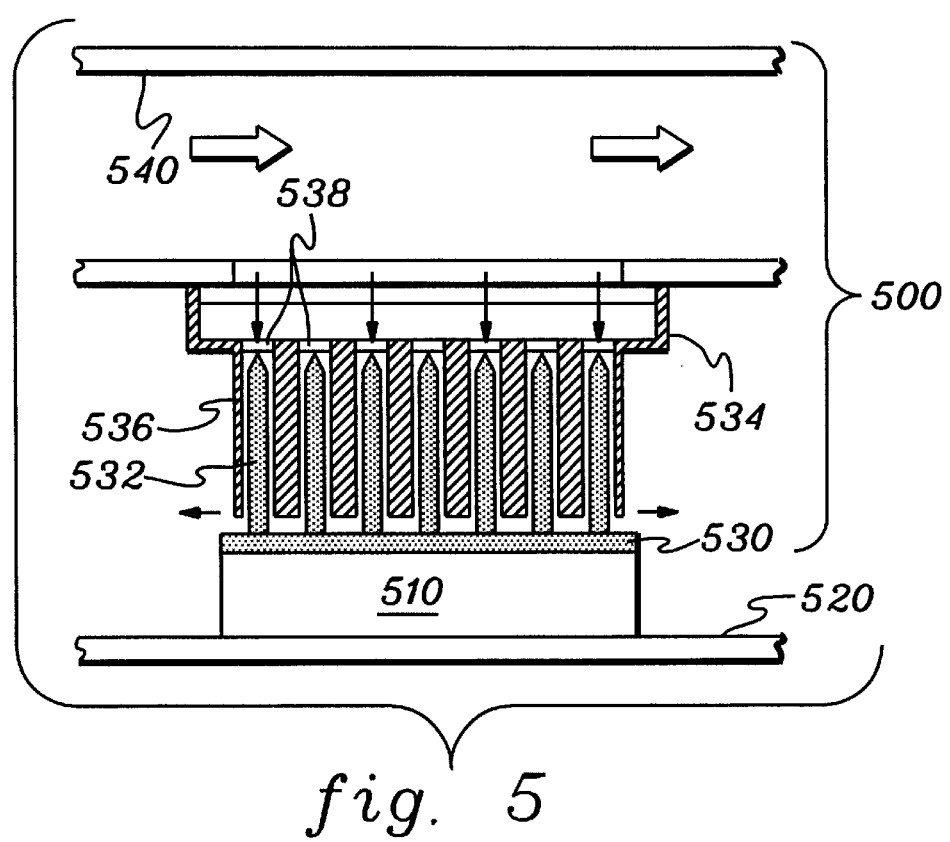
FIG. 5 depicts a cross-sectional view of an alternate embodiment of a cooling assembly, electronic module and printed circuit board, wherein the cooling assembly employs an airflow block shroud, in accordance with an aspect of the present invention.

FIG. 5 depicts an alternate embodiment of an airflow tube assembly 534 for a cooling apparatus 500, in accordance with an aspect of the present invention. Apparatus 500 is again shown mounted to an electronic module 510 which is connected to a printed circuit board 520. The cooling assembly includes a heat sink structure 530 from which a plurality of fins 532 extend. Airflow tube assembly 534 comprises, in one example, a monolithic structure having a plurality of airflow tubes or channels 536 formed therein. The airflow tube assembly could be readily fabricated of plastic employing a molding process. Airflow passes through orifices 538 into the annular passageways defined between the airflow tubes and the respective fins for impinging upon the base surface of the heat sink as explained above in connection with the embodiment of FIGS. 2A–3.

Figure 6:
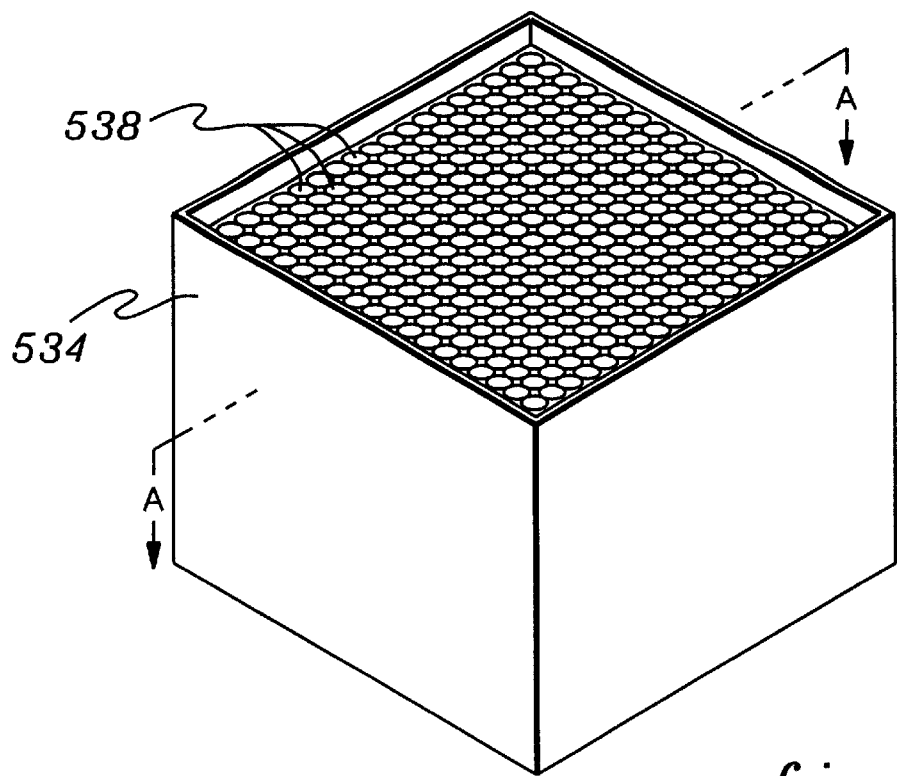
FIG. 6 depicts an isometric view of one embodiment of an airflow tube assembly comprising a block shroud for use in the cooling assembly of FIG. 5, in accordance with an aspect of the present invention.
Figure 6A:
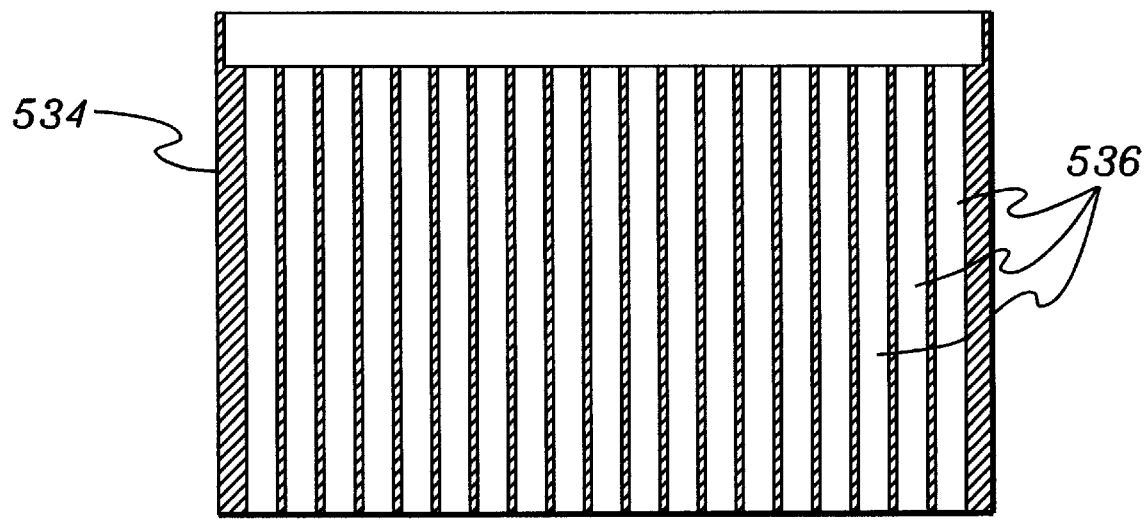
FIG. 6A depicts a cross-sectional view of the block shroud of FIG. 6 taken along line A—A thereof, in accordance with an aspect of the present invention.

FIGS. 6 & 6A depict one embodiment of the airflow tube assembly (or shroud) 534. Again, this airflow tube assembly 534 comprises, in one embodiment, a monolithic structure which has multiple airflow tubes or channels 536 formed therein. Airflow tubes 536 are sized and shaped to receive a respective fin of the heat sink structure as described above in connection with the embodiment of FIGS. 2A–4A.

Figure 7:
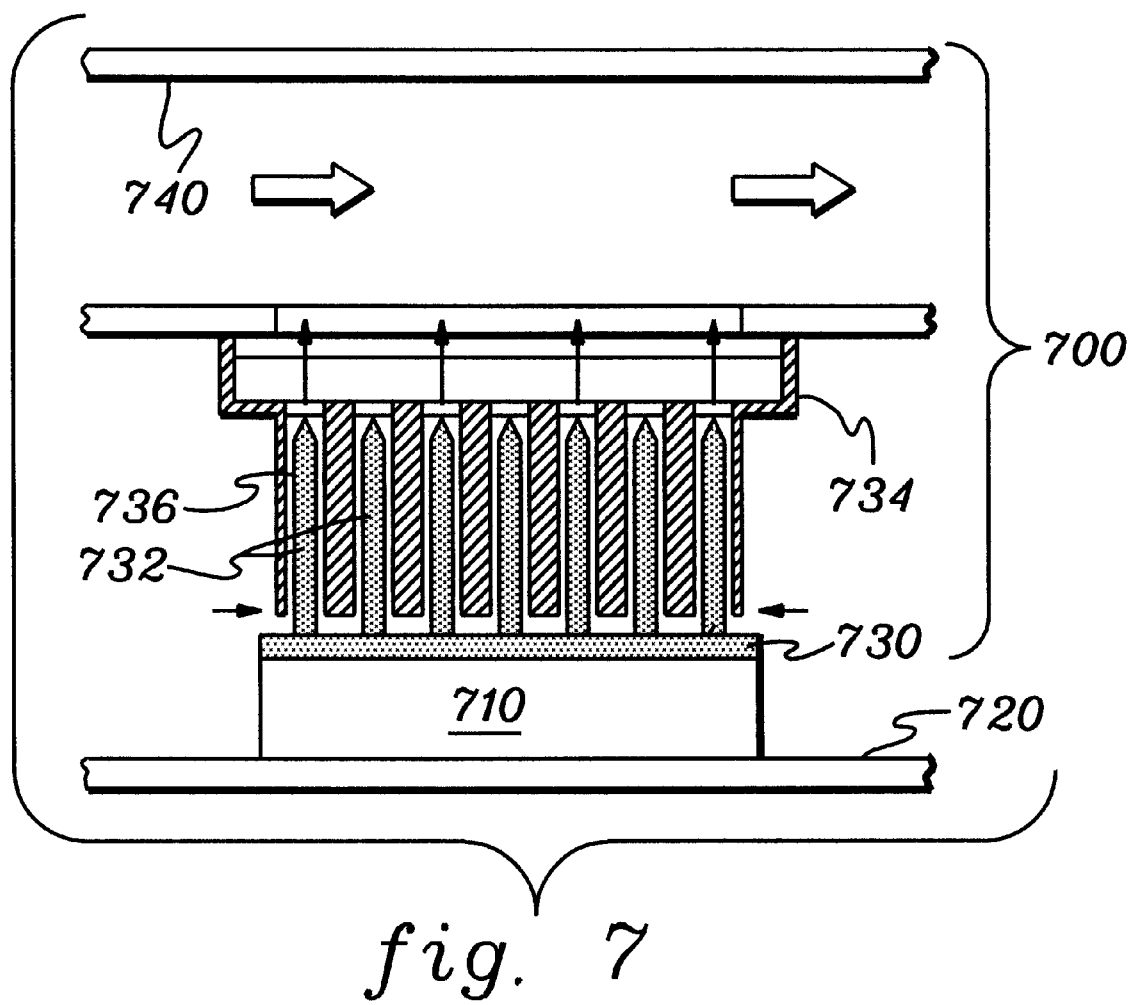
FIG. 7 depicts a cross-sectional view of an alternate embodiment of a cooling assembly, electronic module and printed circuit board, wherein a reverse impinging annular airflows are established to cool the heat sink structure and pin fins extending from a surface thereof, in accordance with an aspect of the present invention.

Another embodiment of a cooling assembly 700 in accordance with an aspect of the present invention is depicted in FIG. 7. In this embodiment, referred to as a reverse impingement airflow approach, air is drawn in from one or more sides of the heat sink structure and exhausted to a suction side of an air moving device in communication with an air exhaust duct 740. Cooling assembly 700 includes a heat sink structure 730 having multiple pin fins 732 and an airflow tube assembly 734 disposed over the multiple pin fins. The airflow tube assembly has a plurality of airflow tubes 736, which together with the pin fins define multiple annular airflow passageways. In this example, the cooling assembly resides over an electronic module 710 connected to a printed circuit board 720, and can be structurally similar to cooling assembly 500 depicted in FIG. 5. A principal difference between the two approaches, however, is that the airflow direction through the annular passageways is reversed.

Figures 8, 8A:
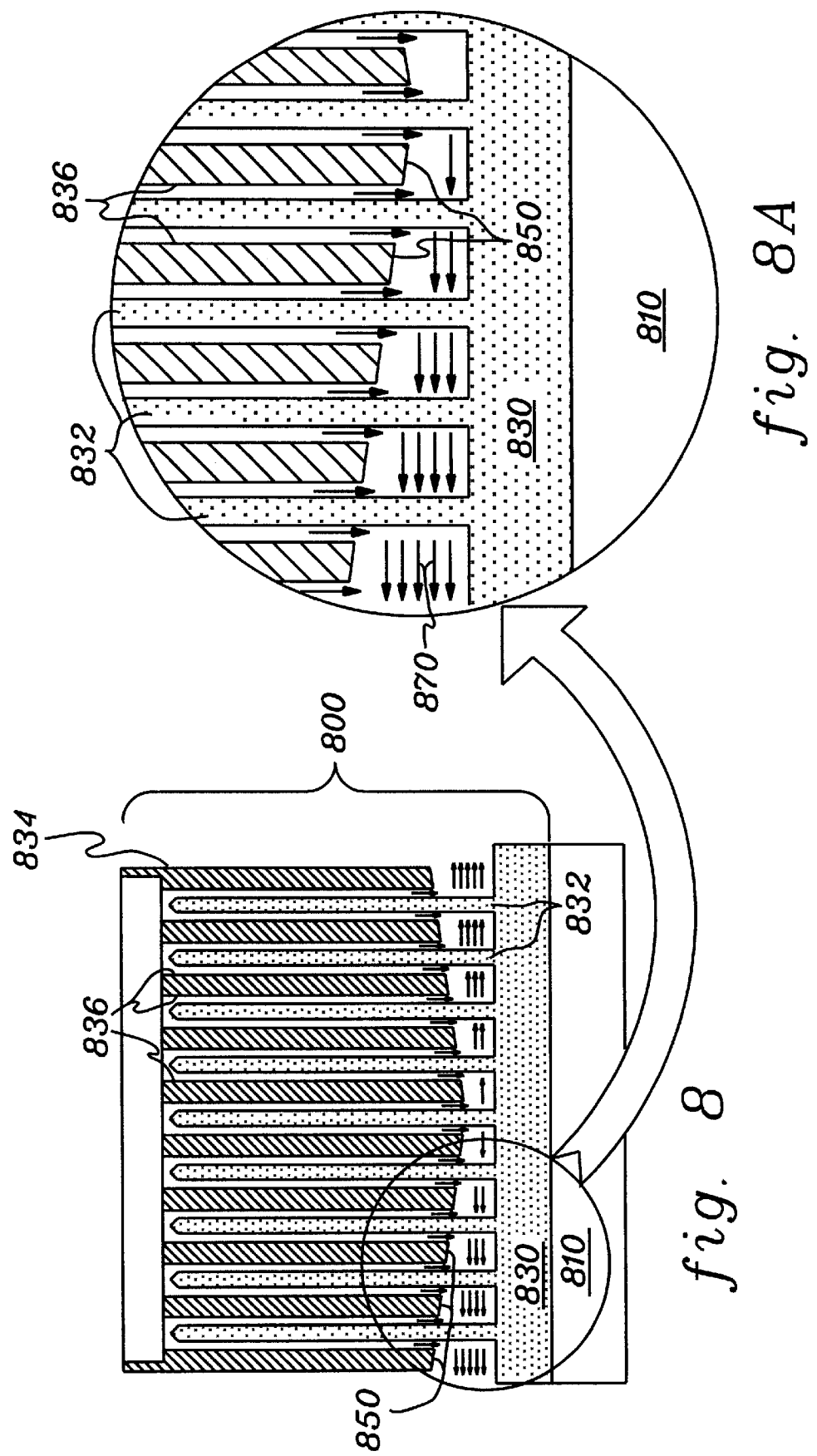
FIG. 8 depicts a cross-sectional view of another embodiment of a cooling assembly and electronic module, wherein the cooing assembly comprises a heat sink structure and conic frustum shroud, in accordance with an aspect of the present invention.
FIG. 8A comprises an enlarged, partial view of the cooling assembly and electronic module of FIG. 8 showing increasing space between the end of the shroud and the base of the heat sink structure, defining a conic frustum extending from a center of the heat sink structure outward to an edge of the heat sink structure, in accordance with an aspect of the present invention.

FIGS. 8 & 8A depict a cooling assembly 800 disposed above a heat generating component, such as an electronic module 810 having one or more integrated circuits. Assembly 800 includes a heat sink structure 830 having a plurality of pin fins 832 extending from a base surface thereof. An airflow tube assembly 834, which is shown to include multiple airflow tubes 836, resides over the fins 832 and may, for example, comprise a monolithic airflow tube assembly as described above in connection with FIGS. 5–6A.

Unique to the embodiment of FIGS. 8 & 8A is a conic frustum section formed at the lower end 850 of the airflow tube assembly 834, also referred to herein as the bottom of the shroud. Airflow through the array of annular passageways exits the heat sink in the space between the heat sink base and the shroud bottom and (in one embodiment) exits radially outward from the heat sink center. Thus, volumetric airflow increases from the center of the heat sink structure radially outward. Under a baseline condition where the shroud bottom is flat, i.e., straight across, the distribution of airflow through the annular passages could vary, with the lowest airflow being in the center and increasing airflow occurring radially outward from the center. Thus, to improve the overall thermal performance of the heat sink, a conic frustum bottom section of the shroud could be added to more evenly distribute the airflow through the array of annular passages. This conic frustum shroud is shown best in FIG. 8A where end 850 of the shroud is angled to allow for an increasing amount of airflow radially 870 outward from the center of the heat sink towards the edge. This profile could be employed to establish a more even distribution of airflow through the annular passageways.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. Apparatus for cooling a heat generating component, said apparatus comprising:

a heat sink structure having a first surface for coupling to the heat generating component and a second surface with at least one fin extending therefrom; and an airflow tube assembly having at least one airflow tube, the at least one airflow tube being sized to at least partially receive the at least one fin of the heat sink structure, wherein an annular airflow can be established between the at least one airflow tube and the at least one fin of the heat sink structure, thereby enhancing heat transfer from the heat sink structure to air and cooling of the heat generating component.

2. The apparatus of claim 1, further comprising an air moving device for establishing the annular airflow between the at least one airflow tube and at least one fin, wherein the annular airflow comprises one of an impinging airflow on the heat sink structure or a reverse impinging airflow from at least one edge the heat sink structure.

3. The apparatus of claim 1, wherein the at least one fin comprises a plurality of fins extending from the second surface of the heat sink structure, and wherein the at least one airflow tube comprises a plurality of airflow tubes, each airflow tube being sized to at least partially receive a respective fin of the plurality of fins of the heat sink structure, wherein an annular airflow can be established between each airflow tube and respective fin pair of the heat sink structure.

4. The apparatus of claim 3, wherein a space is defined between each airflow tube of the plurality of airflow tubes and its respective fin of the plurality of fins, wherein the annular airflow is to be established through said space.

5. The apparatus of claim 3, wherein the space defined between different airflow tubes and respective fin pairs is the same.

6. The apparatus of claim 3, wherein the space defined between at least some airflow tubes and respective fins pairs is different.

7. The apparatus of claim 3, wherein the plurality of airflow tubes comprise at least one end spaced from the second surface of the heat sink structure.

8. The apparatus of claim 7, wherein the spacing between the at least one end and the second surface of the heat sink structure at least partially varies across the heat sink structure.

9. The apparatus of claim 8, wherein the spacing between the at least one end of the plurality of airflow tubes and the second surface of the heat sink structure increases from a center of the heat sink structure outward towards an edge of the heat sink structure, and wherein the airflow tube assembly having the plurality of airflow tubes comprises a conic frustum shroud.

10. The apparatus of claim 3, wherein the plurality of airflow tubes comprise a plurality separate airflow tubes which are mechanically coupled to a plate to form a tube shroud which resides over the plurality of fins extending from the second surface of the heat sink structure.

11. The apparatus of claim 3, wherein the plurality of airflow tubes comprise a plurality of channels defined in a block, wherein the airflow tube assembly comprises a block shroud which resides over the plurality of fins extending from the second surface of the heat sink structure.

12. The apparatus of claim 3, wherein the plurality of fins comprise a plurality of pin fins extending from the second surface of the heat sink structure, and wherein upper ends of at least some fins of the plurality of pin fins have a shape to reduce pressure drop loss due to establishing annular airflows within spaces defined between the airflow tubes and respective fins.

13. An electronic assembly comprising:
an electronic module comprising a heat generating component;
a cooling apparatus coupled to a surface of the electronic module for removing heat generated by the heat generating component, the cooling apparatus comprising:
a heat sink structure having a first surface coupled to the heat generating component and a second surface with at least one fin extending therefrom; and
an airflow tube assembly having at least one airflow tube,; the at least one airflow tube being sized to at least partially receive the at least one fin of the heat sink structure, wherein an annular airflow can be established between the at least one airflow tube and the at least one fin of the heat sink structure, thereby enhancing heat transfer from the heat sink structure to air and cooling of the heat generating component.

14. The electronic assembly of claim 13, further comprising an air moving device for establishing the annular airflow between the at least one airflow tube and the at least one fin of the cooling apparatus, wherein the annular airflow comprises one of an impinging airflow on the heat sink structure or a reverse impinging airflow from at least one edge of the heat sink structure.

15. The electronic assembly of claim 13, wherein the at least one fin comprises a plurality of fins extending from the second surface of the heat sink structure, and wherein the at least one airflow tube comprises a plurality of airflow tubes, each airflow tube being sized to at least partially receive a respective fin of the plurality of fins of the heat sink structure, wherein an annular airflow can be established between each airflow tube and respective fin pair of the heat sink structure.

16. The electronic assembly of claim 15, wherein a space is defined between each airflow tube and respective fin pair, with the annular airflows to be established within said spaces, and wherein said spaces can be a same size or a different size across the heat sink structure.

17. The electronic assembly of claim 15, wherein the plurality of airflow tubes comprise at least one end spaced from the second surface of the heat sink structure, and wherein the spacing between the at least one end and the second surface of the heat sink structure at least partially varies across the heat sink structure.

18. The electronic assembly of claim 17, wherein the spacing between the at least one end of the plurality of airflow tubes and the second surface of the heat sink structure increases from a center of the heat sink structure outward towards an edge of the heat sink structure, and wherein the airflow tube assembly having the plurality of airflow tubes comprises a conic frustum shroud.

19. The electronic assembly of claim 15, wherein the plurality of fins comprise a plurality of pin fins extending from the second surface of the heat sink structure, and wherein upper ends of the at least some fins of the plurality of pin fins have a shape to reduce pressure drop loss due to establishing annular airflows within spaces defined between the airflow tubes and respective fins.

20. The electronic assembly of claim 13, wherein the heat generating component of the electronic module comprises an integrated circuit.

21. A method of fabricating a cooling apparatus for a heat generating component, said method comprising:
providing a heat sink structure having a first surface for coupling to the heat generating component and a second surface with at least one fin extending therefrom; and
providing an airflow tube assembly having at least one airflow tube, the at least one airflow tube being sized to at least partially receive the at least one fin of the heat sink structure, wherein an annular airflow can be established between the at least one airflow tube and the at least one fin of the heat sink structure, thereby enhancing heat transfer from the heat sink structure to air and cooling of the heat generating component.

22. The method of claim 21, further comprising providing an air moving device for establishing the annular airflow between the at least one airflow tube and the at least one fin, wherein the annular airflow comprises one of an impinging airflow on the heat sink structure or a reverse impinging airflow from at least one edge of the heat sink structure.

* * * * *